United States Patent
Sherazi et al.

(10) Patent No.: US 8,134,114 B2
(45) Date of Patent: Mar. 13, 2012

(54) DIRECT ATTACH OPTICAL RECEIVER MODULE AND METHOD OF TESTING

(75) Inventors: Imran Sherazi, Ottawa (CA); Stephen J. Kovacic, Ottawa (CA)

(73) Assignee: Gennum Corporation (CA)

( * ) Notice: Subject to any disclaimer, the term of this patent is extended or adjusted under 35 U.S.C. 154(b) by 0 days.

(21) Appl. No.: 12/835,923

(22) Filed: Jul. 14, 2010

(65) Prior Publication Data

US 2010/0276575 A1 Nov. 4, 2010

Related U.S. Application Data

(63) Continuation of application No. 12/120,813, filed on May 15, 2008, now Pat. No. 7,781,720, which is a continuation of application No. 11/199,981, filed on Aug. 9, 2005, now Pat. No. 7,391,005, which is a continuation-in-part of application No. 10/279,719, filed on Oct. 25, 2002, now Pat. No. 7,224,910.

(51) Int. Cl.
*H01L 31/00* (2006.01)
*H01L 23/48* (2006.01)
*H03F 3/08* (2006.01)

(52) U.S. Cl. .................. 250/214.1; 250/214 A; 257/784
(58) Field of Classification Search ............... 250/214.1, 250/214 A, 214 LA, 214 R; 257/777–778, 257/784; 398/162–164, 207, 212
See application file for complete search history.

(56) References Cited

U.S. PATENT DOCUMENTS

| | | | | | |
|---|---|---|---|---|---|
| 4,618,763 | A | * | 10/1986 | Schmitz | 250/214.1 |
| 5,243,192 | A | * | 9/1993 | Miyauchi et al. | 250/338.1 |
| 2002/0134919 | A1 | * | 9/2002 | Washburn et al. | 250/214 A |

* cited by examiner

*Primary Examiner* — Georgia Y Epps
*Assistant Examiner* — Don Williams
(74) *Attorney, Agent, or Firm* — Jones Day

(57) ABSTRACT

A direct attach optical receiver module and a system and method for testing the direct attach optical receiver module are provided. An optical receiver module may include an optical detector and an integrated circuit with an integrated amplifier circuit and at least one integrated capacitor. In one example, the optical detector may be physically attached to the integrated circuit and the output port of the optical detector may be electrically coupled to the input port of the integrated circuit. In another example, a redistribution layer that includes a tuning inductor may be being physically attached between the optical detector and the integrated circuit.

4 Claims, 14 Drawing Sheets

DIRECT ATTACH OPTICAL RECEIVER MODULE AND METHOD OF TESTING

CROSS-REFERENCE TO RELATED APPLICATION

The present application is a continuation of U.S. patent application Ser. No. 12/120,813, filed on May 15, 2008, which is a continuation of U.S. Pat. No. 7,391,005, filed on Aug. 9, 2005, which is a continuation-in-part of U.S. Pat. No. 7,224,910, filed on Oct. 25, 2002.

FIELD

The technology described in this patent document relates generally to optical receivers. More particularly, a direct attach optical receiver module and a system and method for testing the direct attach optical receiver module are provided.

BACKGROUND

Optical receiver modules used for receiving high speed (e.g., GHz) optical data signals propagating along an optical fiber are known to those of skill in the art. Typically within these optical receiver modules there is an optical detector electrically coupled to an amplifier circuit in such a manner that light from the optical fiber illuminates the optical detector, the optical detector generates photocurrent in response thereto, and the amplifier circuit amplifies this photocurrent. The optical qualities of the optical detector are typically determined at least in part by the material structure of the optical detector. For some ranges of wavelengths, the materials of choice for the optical detector are costly, and as such, semiconductor materials used for manufacturing the amplifier circuit and the optical detector are typically not the same.

Typically, the amplifier circuit, optical detector and associated decoupling capacitors are sourced separately. Thereafter, the optical detector, the amplifier circuit, decoupling capacitors, and a module housing are assembled to form an optical receiver. Typically, the housing is designed for easy coupling to an optical fiber. Because these modules are used for receiving high speed optical data, the length of bond wires used to connect the optical detector to the amplifier acts as an integral component of the high speed input stage to the amplifier. Thus, the module may be more or less sensitive to incoming optical signals, depending on an exact configuration and manufacture.

In manufacturing, manufacturers typically are unable consistently to achieve optimal optical operating characteristics for the assembled receiver modules because the wires coupling the detector to the amplifier circuit play an important role in the performance of the receiver module and are known to vary significantly in manufacture.

Furthermore, isolated testing of the amplifier circuit is not representative of final performance until tested with a detector coupled thereto. Thus, meaningful testing can only be conducted at the completed receiver module level.

Finally, the performance of the module or some subset of the entire assembly will also be dependent upon the value, position, and performance of the power supply decoupling capacitors. These capacitors are integrated into the module by the manufacturer and contribute to the difficulty of designing a manufacturable module.

As a result a need therefore exists to manufacture the receiver module in such a manner that facilitates testing of the receiver module as a complete system in order to eliminate effects that yield undesirable performance prior to selling thereof. Chip level integration is desirable for test and manufacture, however, optimum TIA and optical diode technologies are fundamentally different, and therefore do not easily allow monolithic integration.

SUMMARY

In accordance with the teachings described herein, a direct attach optical receiver module and a system and method for testing the direct attach optical receiver module are provided.

In one example, an optical receiver module may include an optical detector and an integrated circuit. The optical detector may include a photosensor for receiving light and an output port for providing a photocurrent. The integrated circuit may include an integrated amplifier circuit and at least one integrated capacitor. The integrated circuit may include an input port for receiving the photocurrent. The optical detector may be physically attached to the integrated circuit and the output port of the optical detector may be electrically coupled to the input port of the integrated circuit. The optical detector, integrated amplifier circuit and at least one integrated capacitor may provide a closed loop circuit devoid of any unwanted bondwire inductance allowing an easy path for AC signals.

In another example, an optical receiver module may include an optical detector, and integrated circuit and a redistribution layer. The optical detector may include a photosensor for receiving light and an output port for providing a photocurrent. The integrated circuit may include an input port for receiving the photocurrent. The redistribution layer may include a tuning inductor, and may be being physically attached between the optical detector and the integrated circuit. The tuning inductor may be electrically coupled in series between the output port of the optical detector and the input port of the integrated circuit.

A method of manufacturing an optical receiver module may include the following steps: providing an integrated circuit that includes an input port for receiving the photocurrent; determining a desired inductance for the optical receiver module; fabricating a redistribution layer on the integrated circuit, the redistribution layer including a tuning inductor having an inductance value that is selected to achieve the desired inductance for the optical receiver module; and attaching an optical detector to the redistribution layer. The tuning inductor may be electrically coupled in series between an output port of the optical detector and an input port of the integrated circuit.

A method of testing an optical receiver module may include the following steps: physically attaching an optical detector to an integrated circuit and electrically coupling an output port of the optical detector to an input port of the integrated circuit to form the optical receiver module such that the optical detector and the integrated circuit provide a closed loop circuit devoid of any unwanted bondwire inductance allowing an easy path for AC signals; illuminating the optical detector with a light source; coupling a bias voltage to the integrated circuit; and determining a response to of the optical receiver module to evaluate a performance characteristic thereof.

DETAILED DESCRIPTION

Figure 1A:
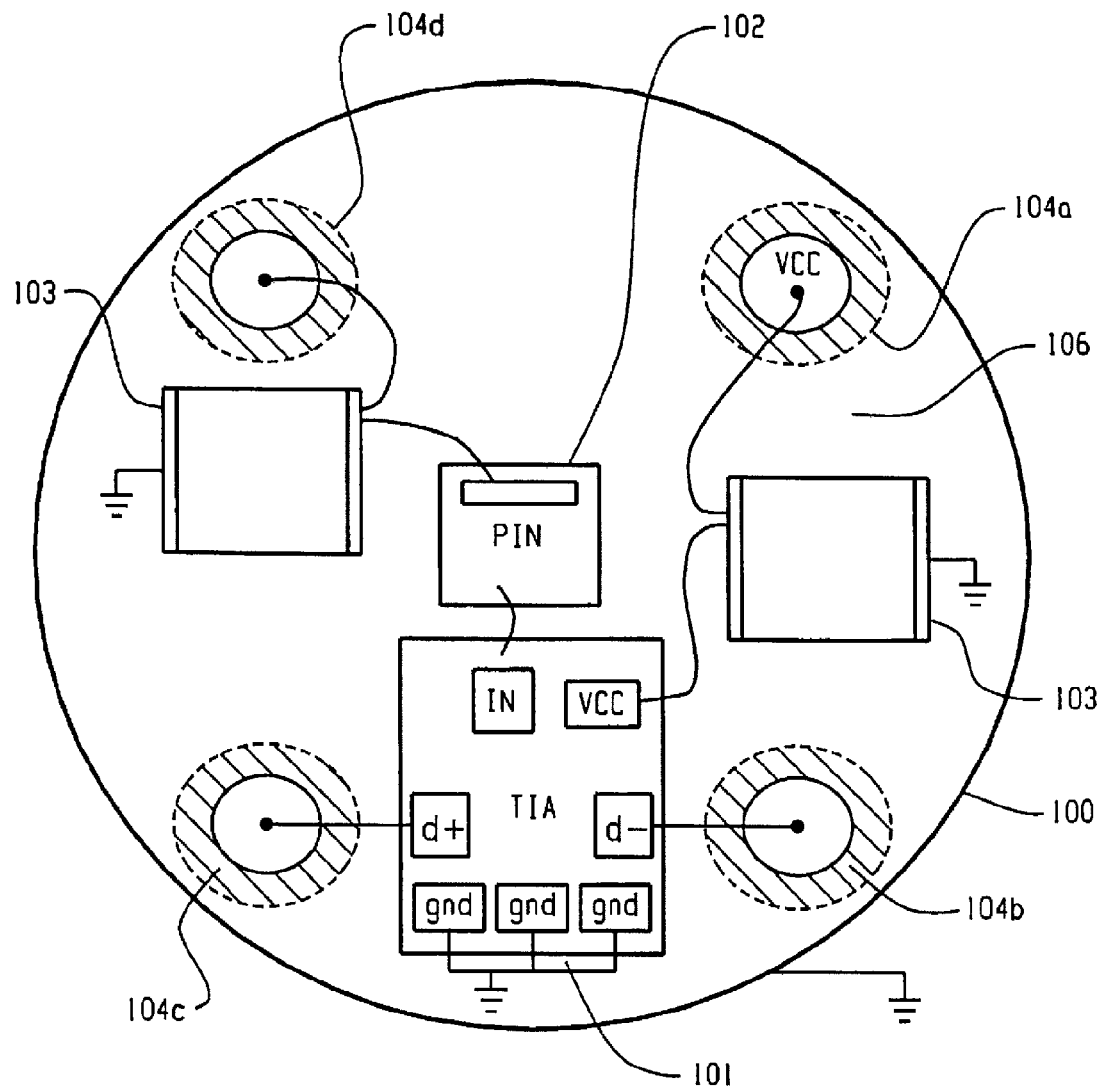
FIG. 1a and FIG. 1b illustrate a prior art optical receiver module.
Figure 1B:
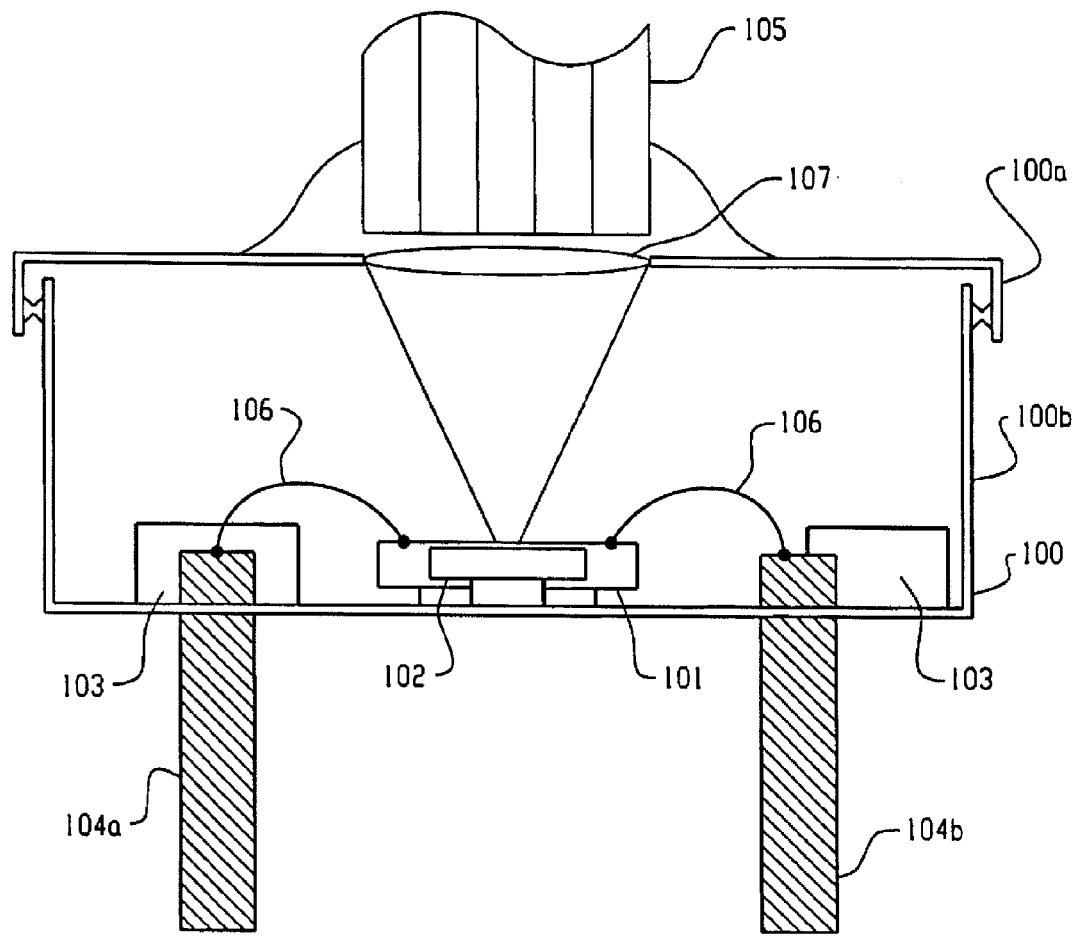

In FIG. 1a and FIG. 1b, a prior art optical receiver module 100 is illustrated. A housing 100a and 100b (e.g., consisting of a TO-46 package header) is used to enclose the optical receiver components, including an integrated transimpedance amplifier circuit (TiA) 101, de-coupling capacitors 103, and an optical detector 102, in the form of a PIN diode. Four header pins 104a through 104d penetrate the housing and at least three of them are electrically insulated therefrom. Bond wires 106 are used within the optical receiver module 100 to electrically connect internal component input and output ports to the four header pins 104a through 104d and to each other. Input ports disposed on the TiA 101 are for receiving a photocurrent from the integrated optical detector 102 wire bonded thereto. The de-coupling capacitors 103 are provided to decouple a bias voltage to the TiA 101 and to decouple a bias voltage to the PIN diode 102.

As depicted in FIG. 1b, the prior art optical receiver module is optically coupled to an optical fiber 105 via a lens 107 disposed in an aperture formed in a lid 100a of the housing 100a, 100b. The lens 107 is disposed between an end of the optical fiber 105 proximate the optical receiver module and the optical detector 102. The lens 107 is used to focus light from the optical fiber 105 onto the optical detector 102.

Typically, when the components 101-103 of the prior art optical receiver module are placed within the TO-46 package, the positioning of the detector 102 due to optical considerations, requires that the resultant placement of the TiA 101 and capacitors 103 are not optimized for electrical performance. The typical component placement used in the prior art involves positioning of the optical detector in a geometric center of the housing 100b, with the TiA 101 positioned between two header pins 104c and 104b, and the de-coupling capacitors 103 placed on either side of the optical detector 102 between header pins 104c and 104d, and 104a and 104b. The placement of these components 101-103, as well as lengths of bond wires used to form connections therebetween, is often an important factor in the optical receiver's performance. The bond wire thickness, length, and position between the optical detector 102 and the TiA 101 often has a significant affect on performance. If these bond wires 106 are too thin, too long or incorrectly positioned, then the effects thereof may adversely affect optical receiver performance. Thus, in order to ensure optimal performance of the optical receiver module, component types 101-103 as well as the types of bond wires 106 used for internal connections, may be important. Therefore, through careful design and component selection optimal performance may be achieved, however this conies at a cost of having to fully assemble the optical receiver module 100 prior to testing. In other words, an assembly that fails testing, represents a loss of all costs used for assembly thereof.

The prior art optical receiver modules are typically not tested until they are fully assembled. This significantly affects optical receiver module manufacturing costs. During manufacturing, multiple TiAs 101 are formed on a semiconductor wafer. Due to manufacturing variances, performance of the TiAs and detectors vary across their wafers and in some cases individual TiAs and detectors will be combined to produce undesirable performance. Since only the individual components are tested (and without associated interconnect (bondwires)), it is unknown how the manufactured TiA 101, and optical detector 102 wire bonded thereto, will operate until the device is fully assembled in the housing (100a and 100b). Thus, significant manufacturing costs may be incurred because of the unknown performance characteristics of the optical receiver until final packaging due to variation in interconnect.

Figure 2A:
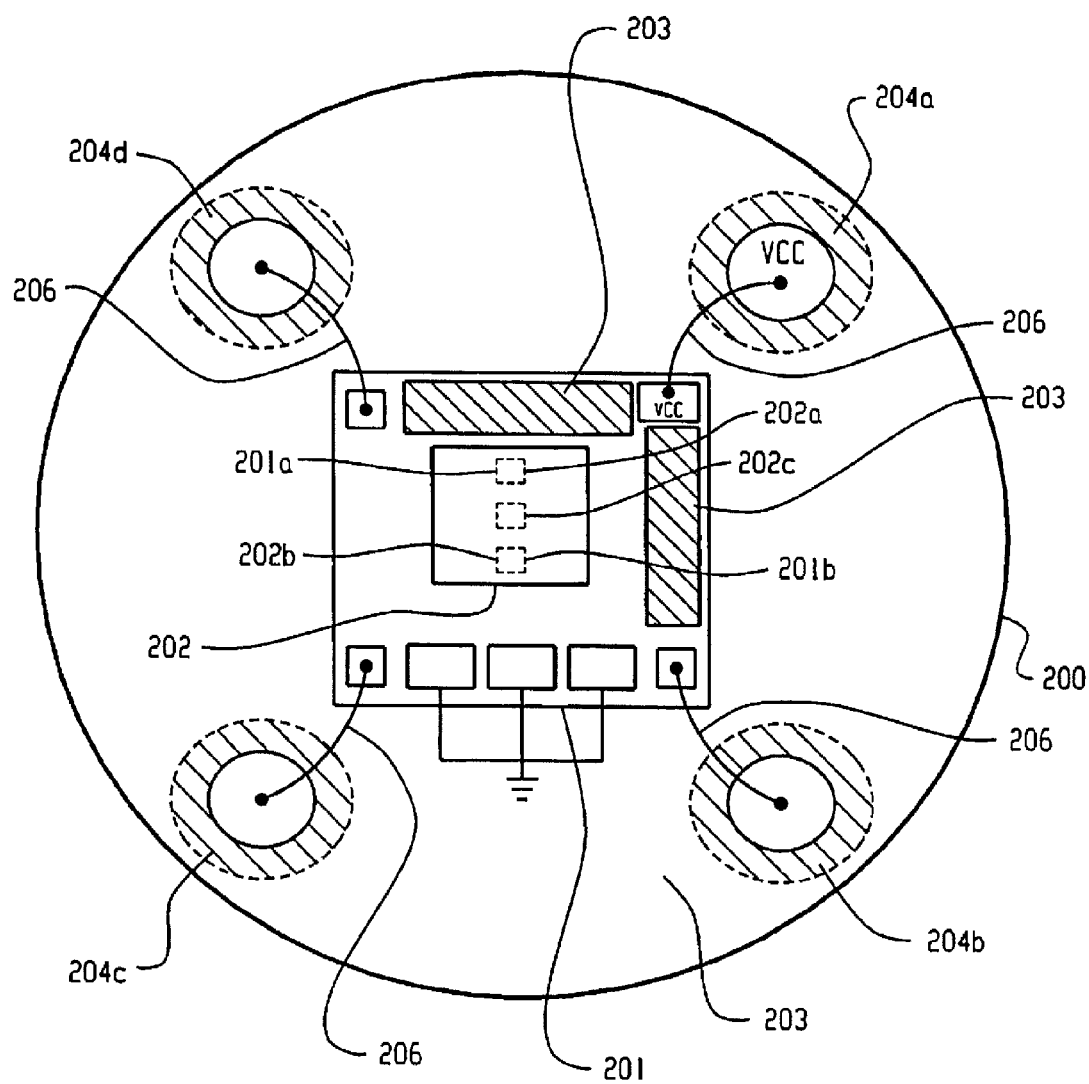
FIG. 2a and FIG. 2b depict an example optical receiver module having an integrated optical detector.
Figure 2B:
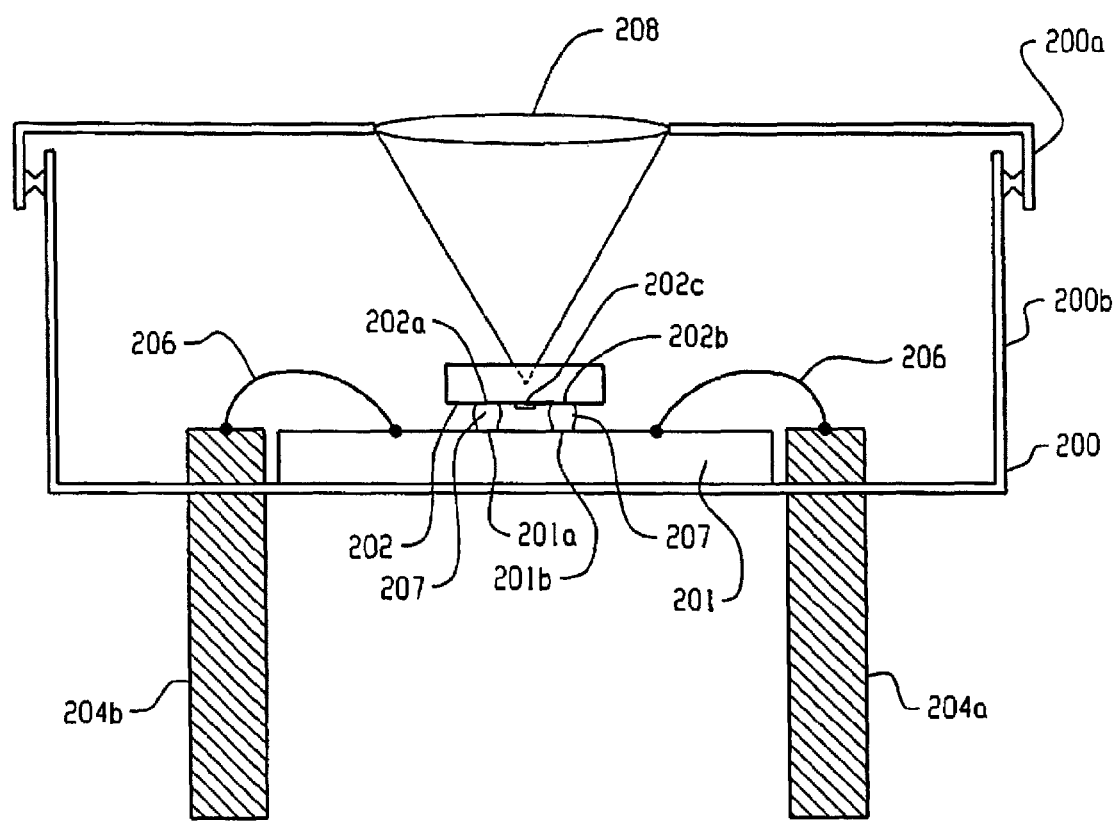
Figure 2C:
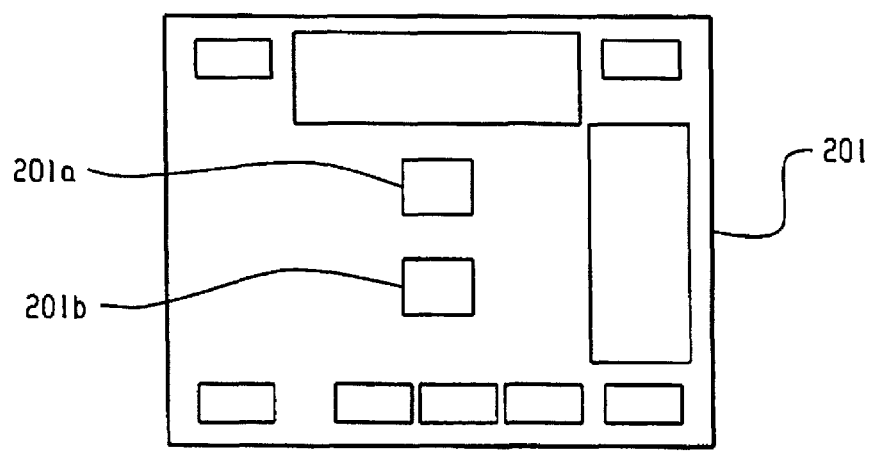
FIG. 2c illustrates an integrated circuit having bonding pads for receiving a flip-chipped optical detector.
Figure 2D:
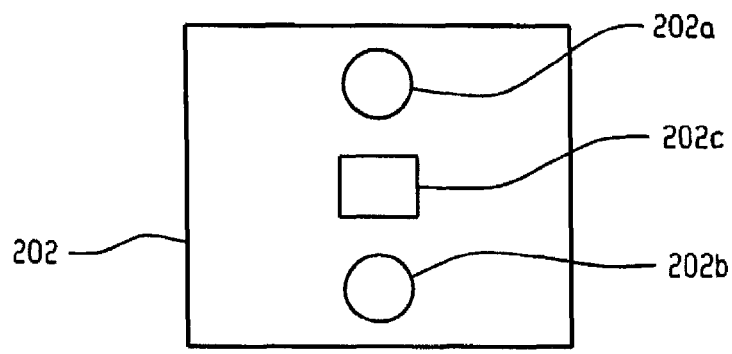
FIG. 2d illustrates the integrated optical detector having a light receiving photosensitive area adjacent two metalized pads.
Figure 2E:
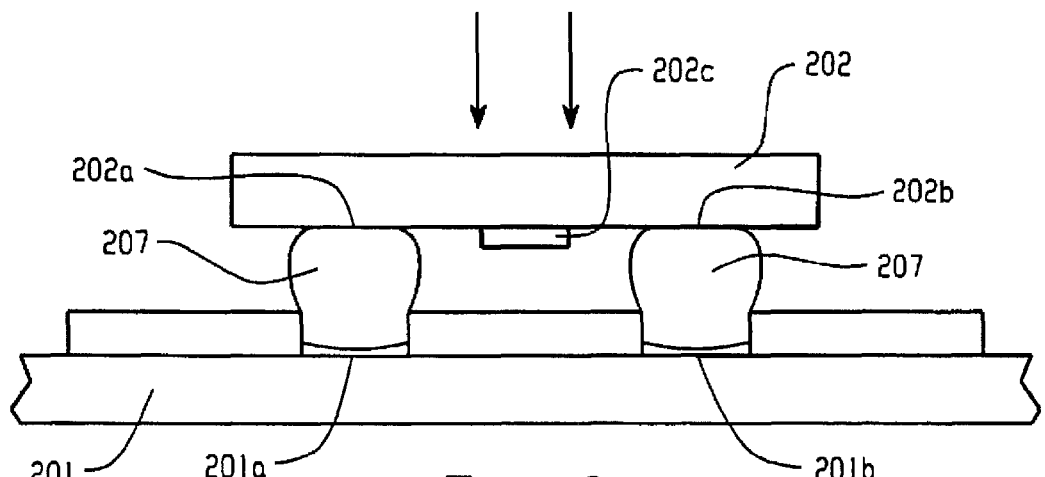
FIG. 2e illustrates back illumination of the integrated optical detector.

In FIG. 2a, an example an optical receiver module 200 is depicted that includes an integrated optical detector 202, in the form of a PIN diode, having a light receiving photosensitive area 202c adjacent two metalized pads 202a and 202b (FIG. 2d) on a connection side thereof. A housing 200a and 200b as illustrated in FIG. 2b, such as a TO-46 package, is used to enclose the optical receiver components, in the form of an integrated circuit 201 with integrated capacitors 203, and the integrated optical detector 202. Four header pins 204a through 204d penetrate the housing and at least three of them are electrically insulated therefrom. Bond wires 206 are used within the optical receiver module 200 to electrically connect the header pins 204a through 204d to the integrated circuit input ports and output port for receiving a bias voltage and for providing an output signal, respectively.

The integrated optical detector 202 is mounted to the integrated circuit 201 using a direct attach technique. In the example depicted in FIGS. 2a-2e, the integrated optical detector 202 is directly attached to the integrated circuit 201 using a "flip-chip" or "bumping" technique, as described below. In other examples, the integrated optical detector 202 may be directly attached to the integrated circuit 201 using other techniques, such as the example described below with reference to FIGS. 8a-8c. The terms "flip-chip" and "bumping" are known to those of skill in the art and their meaning is clarified below for the purposes of this specification and the claims that follow. The connection side (FIG. 2d) of the integrated optical detector 202 has two metalized pads 202a and 202b that serve as the anode and cathode. The upper surface of the integrated circuit 201 (FIG. 2c) also has two metalized pads 201a and 201b, in the form of an input port and an output port that have a spacing therebetween similar to that of the integrated optical detector metalized pads 202a and 202b.

The metalized pads on the integrated circuit are first gold plated. Then the integrated optical detector 202 is positioned with the upper surface of the integrated circuit (FIG. 2*c*) adjacent the integrated optical detector metalized pads 202*a* and 202*b* a connection is made therebetween to fix the integrated optical detector 202 onto the integrated circuit 201 using flip-chip, bumping or some form of direct attach technology. For instance, in the example of FIG. 2*e*, solder 207 is used to directly attach the integrated optical detector 202 to the integrated circuit 201.

If the integrated optical detector 202 is attached to the integrated circuit 201 using a flip-chip or bumping technique, then the use of bond wires to connect the integrated circuit 201 to the integrated optical detector 202 may be eliminated. Moreover, directly attaching the integrated optical detector 202 to the integrated circuit 201 ensures that the integrated optical detector 202 is in close proximity to the integrated circuit 201. Direct attaching of the integrated optical detector 202 onto the integrated circuit 201 reduces the overall transmission wire length on chip, improves group delay of photocurrent propagating from the integrated optical detector 202 to the integrated circuit 201, and furthermore improves repeatable manufacturability. In the example depicted in FIGS. 2*a*-2*e*, the integrated optical detector 202 is back illuminated (FIG. 2*e*) because the connection side of the integrated optical detector 202 having the light receiving photo-sensitive area 202*c* faces the integrated circuit substrate in order to make a flip-chip connection.

In FIG. 2*b*, the optical receiver module 200 is shown having an aperture in the housing lid 200*a* for receiving a lens 208 for focusing received light onto the integrated optical detector 202. The integrated circuit 201 may contain integrated decoupling capacitors 203 and an integrated amplifier circuit, in the form of a transimpedance amplifier circuit. Thus, with the flip-chip technique, the integrated circuit 201 and the integrated optical detector 202 may be oriented about the geometric center of the housing 200*b* in a first orientation (FIG. 2*a*). Orienting of the integrated optical detector 202 and the integrated circuit 201 in the first orientation in the geometric center of the housing (200*a* and 200*b*) allows a for a larger physical size of die because more room is available within the housing containing the integrated circuit 201 and thus allows for additional circuit functionality to be provided therein or for a reduced housing size. The integrated circuit shown has a substantially rectangular shape, thus in the first orientation the integrated circuit has its four corners in close proximity to the four header pins. Bonding pads for the input and output ports are provided on the corners of the substantially rectangular shaped integrated circuit, which allows for short bond wires to be used for making electrical connections to each of the header pins (204*a* through 204*d*).

Figure 3A:
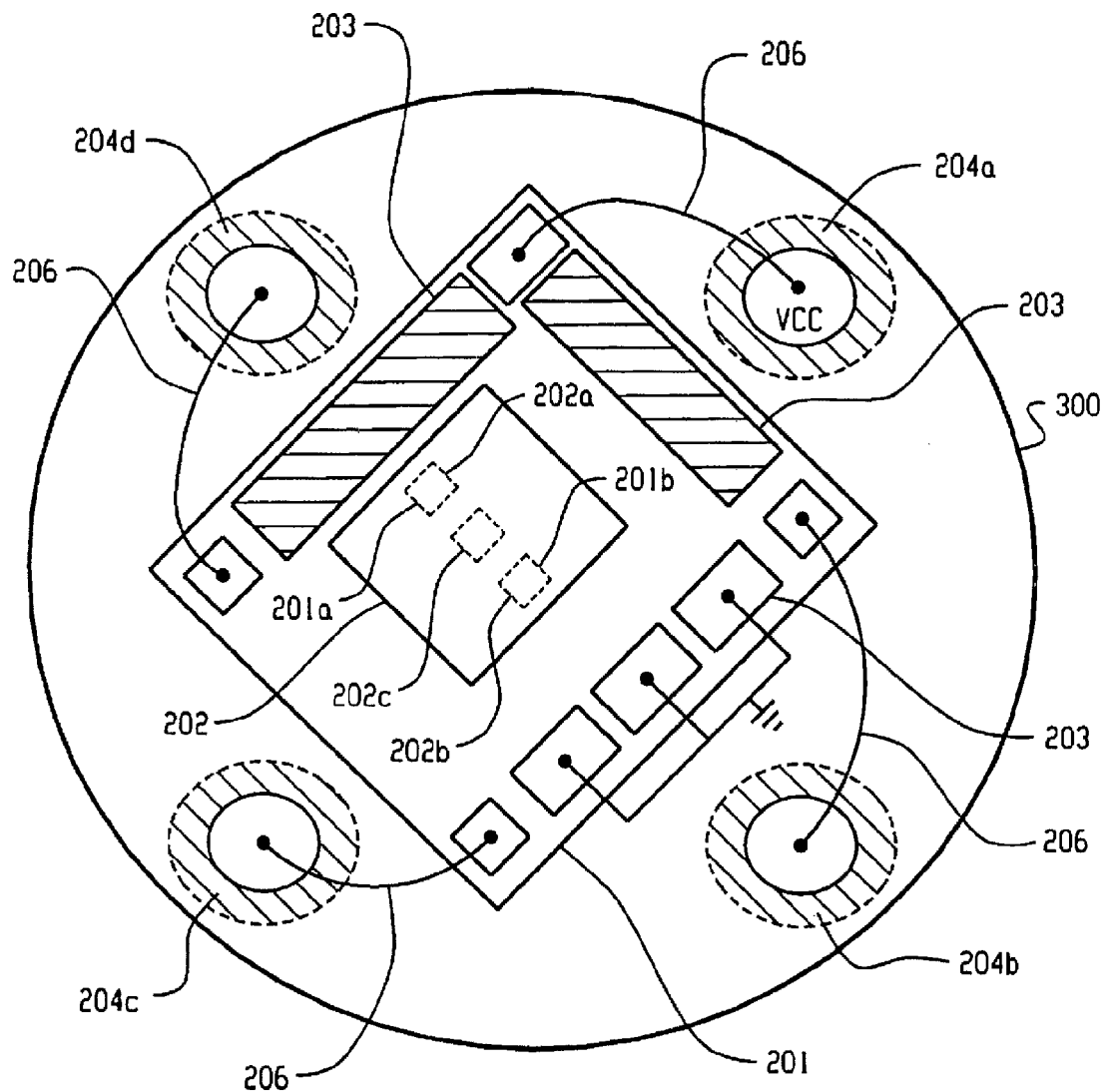
FIG. 3a illustrates a second example orientation of the integrated circuit and integrated optical detector direct attached thereon.
Figure 3B:
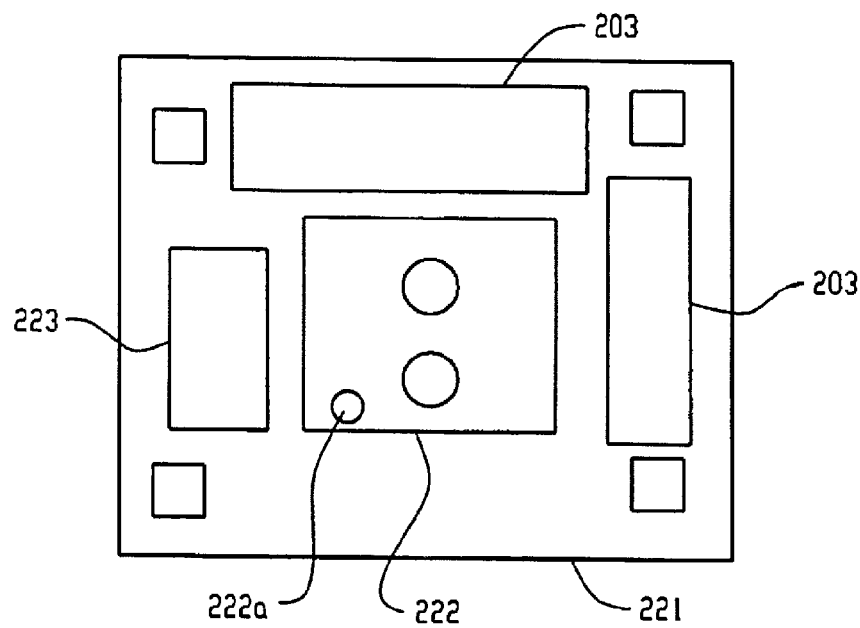
FIG. 3b illustrates an on chip DC-DC converter and integrated avalanche photodiode (APD).

FIG. 3*a* depicts an optical receiver module 300 having a second orientation of the integrated circuit 201 and integrated optical detector 202 direct attached thereon. In this example, the substantially rectangular shaped die used for the integrated circuit 201 is oriented with each side of the semiconductor substrate being other than parallel to a line formed between a header pin and a closest adjacent header pin. This second orientation allows for the physical size of the integrated circuit die to be larger than for the first orientation. Thus, more area is available on the die for adding additional functionality to the integrated circuit, for instance the addition of an on chip DC-DC converter 223 (FIG. 3*b*). The DC-DC converter 223 is for use with an integrated optical detector in the form of an avalanche photodiode (APD) 222, thus an additional input port 222*a* is provide on the APD for receiving an amplified bias voltage from an additional output port provided on the integrated circuit 221.

The first and the second orientations of the integrated circuit and direct attached integrated optical detector both provide a complete 'receiver on a chip' solution that obviates the need for other components on the optical receiver module 100. Additionally, vertical stacking of the integrated optical detector and the integrated circuit maximizes space efficiency and allows for a larger die-size than that which was attainable in the prior art. Using a larger die decreases the number of devices manufacturable on each wafer, however the benefits that are achieved outweigh the additional costs.

The integrated optical detector is typically fabricated using the most suitable technology in dependence upon a desired wavelength band of operation. Typically for optical communications purposes the integrated optical detector is manufactured using InP or GaAs and the integrated circuit is manufactured using Si. In this case, direct attaching may be advantageous because a silicon detector is typically not useable for receiving optical wavelengths used in optical communications.

Figure 4A:
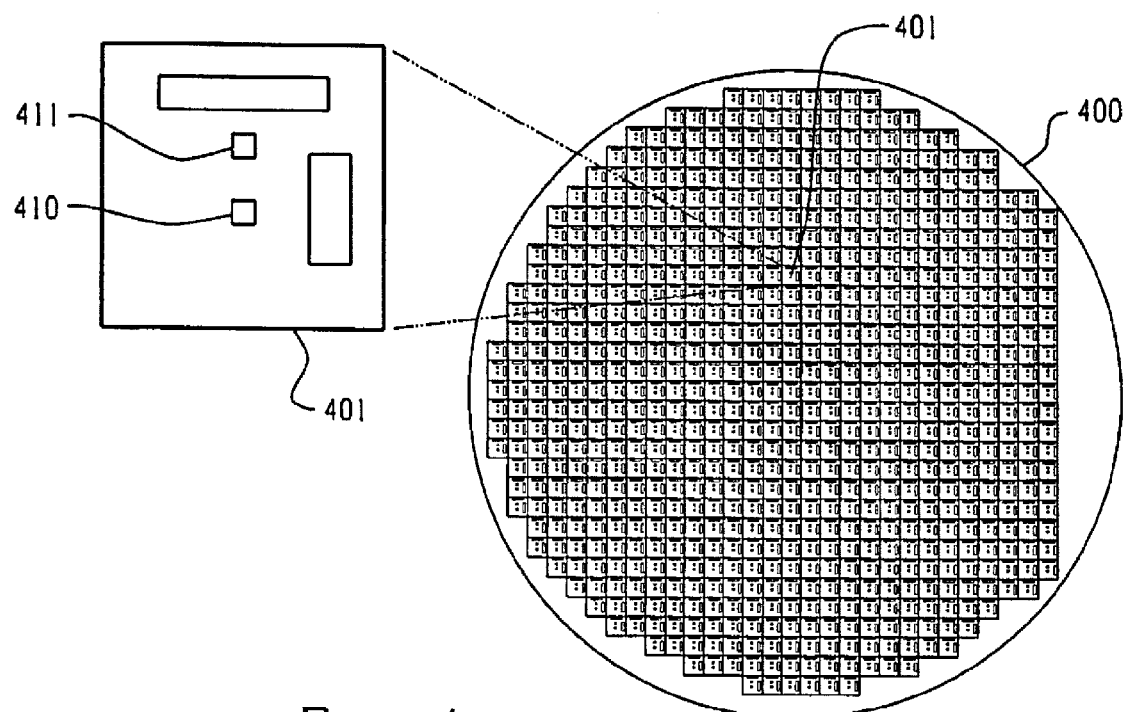
FIG. 4a depicts a semiconductor wafer having a plurality of integrated circuits disposed therein.
Figure 4B:
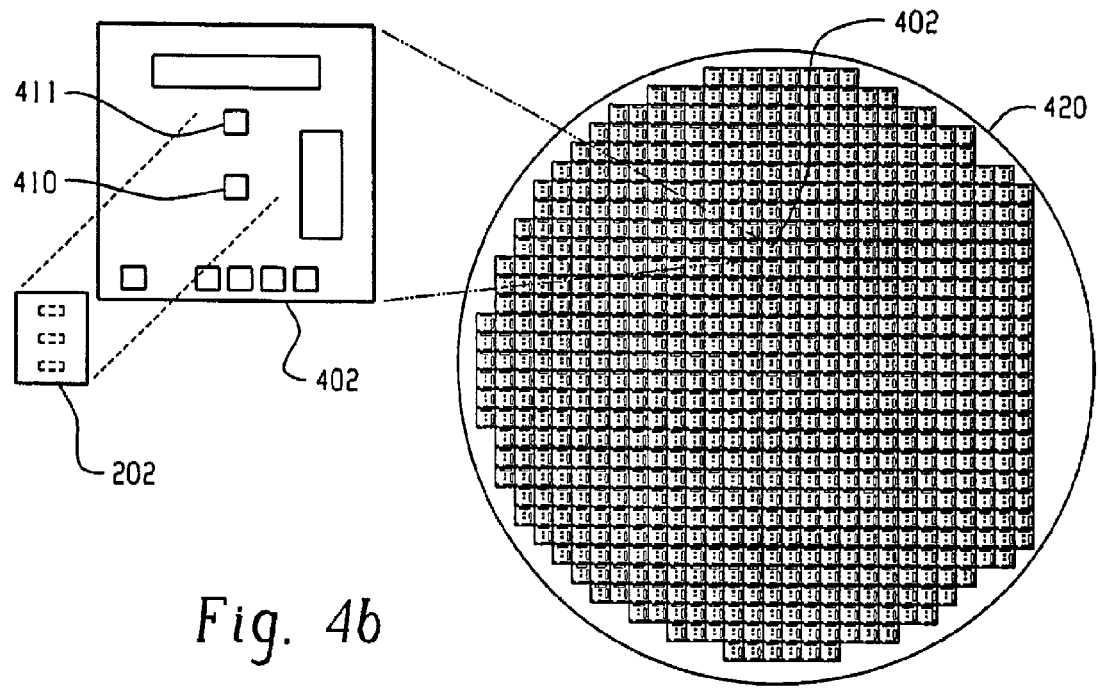
FIG. 4b illustrates a plurality of integrated optical receivers on a chip prior to testing.

In FIG. 4*a*, a semiconductor wafer 400 having a plurality of integrated circuits 401 disposed therein, is shown. The integrated circuits 401 may be oriented on the wafer 400 to maximize the number of devices manufacturable on the wafer 400 at a time. Each integrated circuit 401 has contact pads 411 and 410 for contacting the integrated optical detector 202. An advantageous test scenario is made possible because, an integrated detector 202 is direct attached onto each integrated circuit 401 prior to dicing the wafer, to form an optical receiver on a chip 402. The wafer 420 (FIG. 4*b*) now contains a plurality of optical receivers on a chip 402. Using a testing apparatus 500, such as the example testing apparatus depicted in FIG. 5, each of the optical receivers on a chip 402 is tested to determine its operating characteristics.

Figure 5:
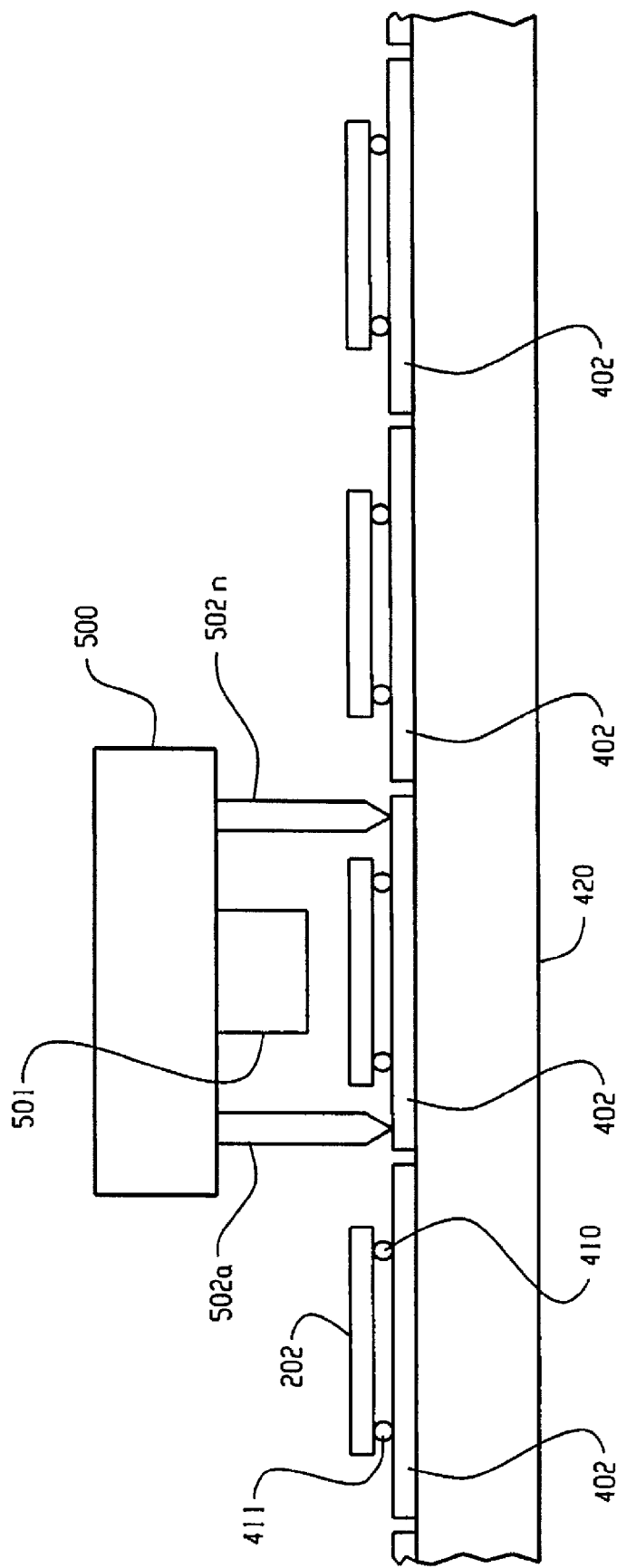
FIG. 5 illustrates a testing apparatus for testing of the plurality of optical receivers on a chip.
Figure 6:
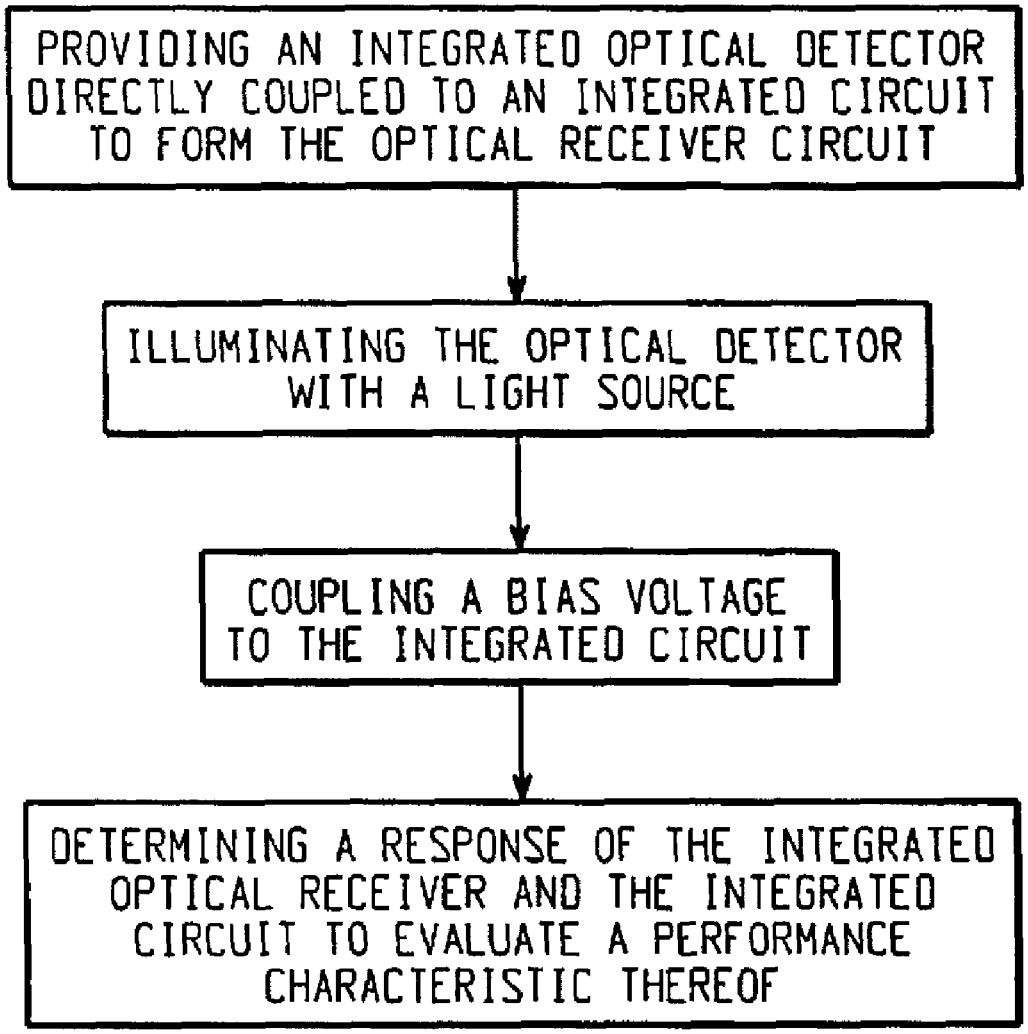
FIG. 6 illustrates an example method for testing a plurality of optical receivers on a chip.

The testing apparatus 500 shown in FIG. 5 has a laser source 501 and a plurality of probes 502*a*-502*n*. For testing purposes, the wafer 420 is placed in the testing apparatus and each optical receiver on a chip 402 is individually tested to determine its operating characteristics, for example using the method steps shown in FIG. 6. Thus in testing, a light source in the form of a laser is aligned to each integrated optical detector portion of each optical receiver on a chip 402. Probes 502*a*-502*n* contact input and output ports on the integrated circuit to provide bias voltage and to read an output signal therefrom, respectively. During testing the optical source 501 should be accurately aligned with the integrated receiver 202. Testing on the wafer 420 allows each optical receiver on a chip 402 to be individually tested using actual high-speed optical signals as if the device were being used as an actual receiver in an optical communication system. This allows for high-speed performance of each optical receiver on a chip 402 to be characterized prior to dicing of the wafer 420 and prior to packaging of the diced optical receivers on a chip 402 into a housing. In addition, tests such as integrated detector responsivity, or even sensitivity and overload, may be performed using the testing apparatus 500. Testing prior to module assembly allows for yield to be determined at a wafer level, which may significantly reduce future module assembly losses. If some of the plurality of optical receiver on a chip 402 do not meet predetermined criteria, they are not sold to the module customer nor assembled.

Figure 4C:
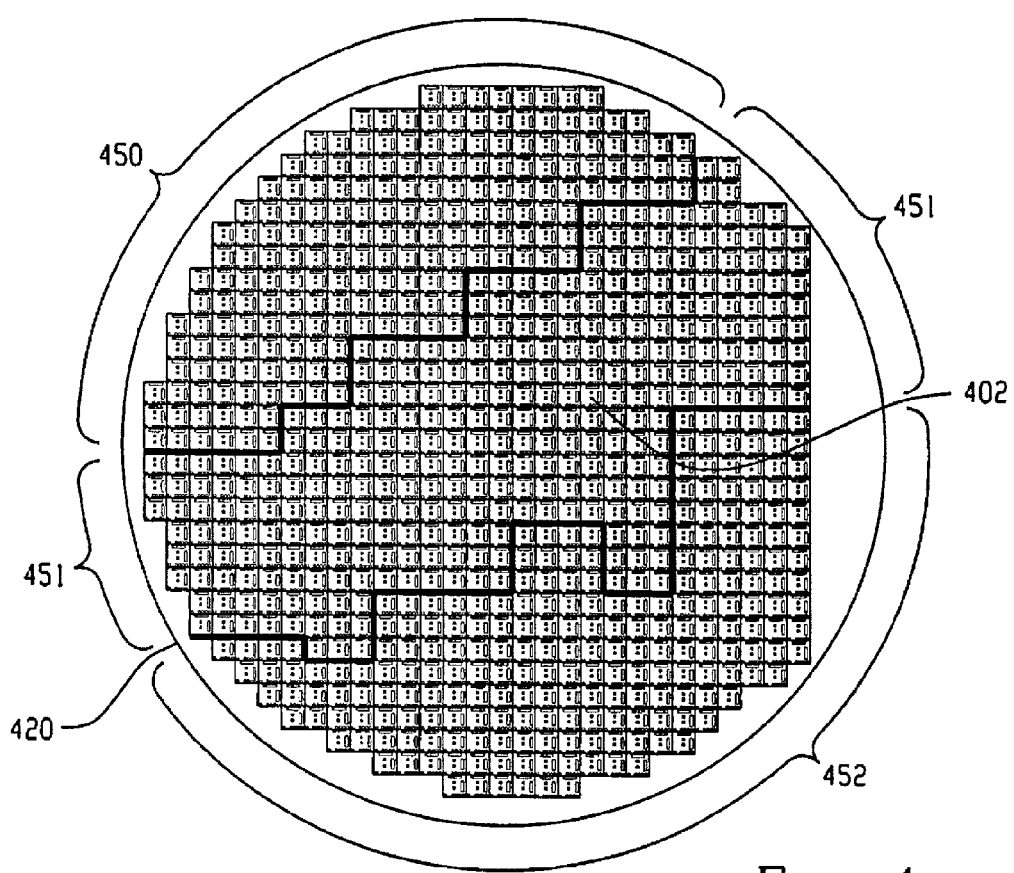
FIG. 4c illustrates a wafer after testing the plurality of optical receivers on a chip.

FIG. 4*c* illustrates a scenario where the wafer 420 has been tested and the plurality of optical receivers on a chip 402 have been grouped on the wafer 420 based on their performance in terms of the predetermined criteria. For instance, the optical receivers on a chip 402 that have a first performance characteristic within a range of performances are grouped in area 450, the optical receivers on a chip 402 that have second performance characteristic within a different range of performances are located in area 451 and those that have a third performance characteristic within another different range of performances are located in area 452. For commercial applications this allows for the manufacturers of these optical receivers on a chip 402 to "bin" the optical receivers into groups having known predetermined performance characteristics, thus advantageously allowing for determination of yield and quality prior to dicing of the wafer 420. If for some reason the process used to manufacture these optical receivers on a chip 402 is not adequate, then costs will be avoided because the wafer is scrapped prior to the expensive process of dicing and assembly. Moreover, partial wafer testing provides an early indication of total yield and allows one to determine if further testing is warranted. Thus, a yield loss is seen at the wafer level and not at the stage of integration into the module, advantageously saving manufacturers money and testing time. Once packaged into optical receiver modules, the performance characteristics are known so the components are binned appropriately. Thus, for an end user, using the tested optical receiver module is much easier because critical receiver design parameters are assured through the device specifications, which are different for devices in different bins. This provides guaranteed optical performance of the optical receiver sold to the module manufacturer and commands a price premium over the individual components sold to the manufacturer under the prior art methods.

Moreover, price is typically established based on the performance characteristics of the devices allowing for enhanced profit margin for those components having a most advantageous performance characteristic.

Figure 7A:
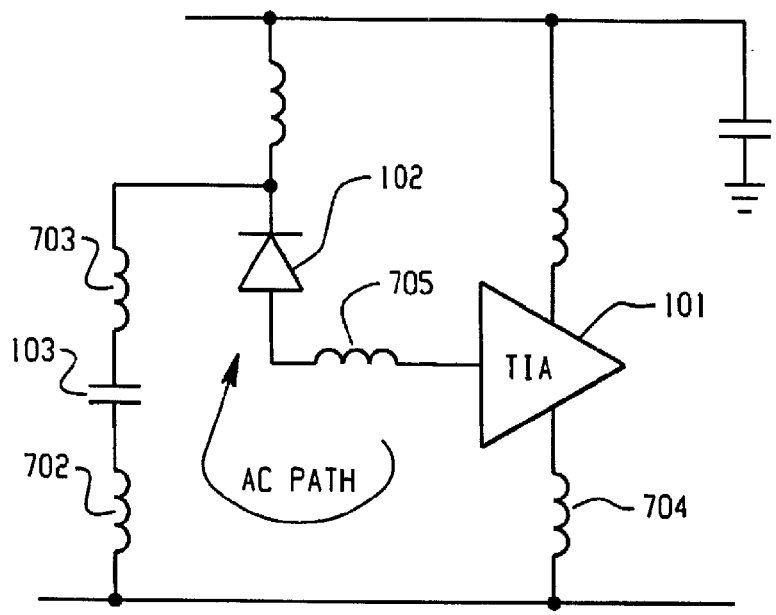
FIGS. 7a and 7b are circuit diagrams comparing the operations of the example prior art optical receiver module depicted in FIGS. 1a and 1b with the example optical receiver modules depicted in FIGS. 2a-2e and FIGS. 8a-8c.
Figure 7B:
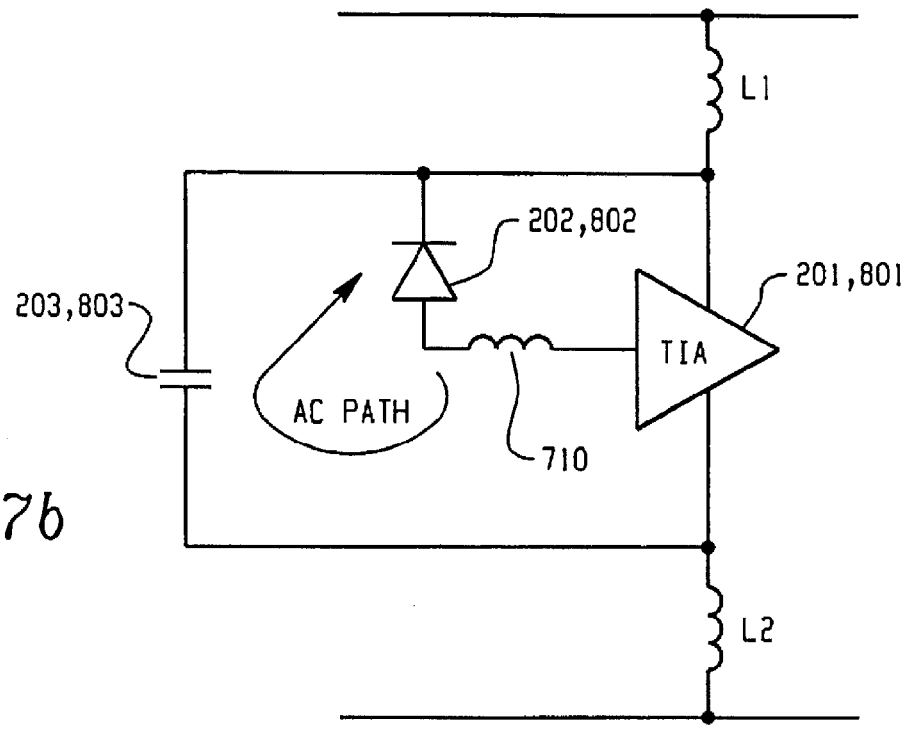

FIGS. 7a and 7b are circuit diagrams comparing the operations of the example prior art optical receiver module 100 depicted in FIGS. 1a and 1b with the example optical receiver modules 200, 800 depicted in FIGS. 2a-2e and FIGS. 8a-8c. FIG. 7a illustrates the operation of the example prior art receiver module 100 depicted in FIGS. 1a and 1b, and FIG. 7b illustrates the operation of the example optical receiver modules 200, 800 depicted in FIGS. 2a-2e and FIGS. 8a-8c.

With reference first to FIG. 7a, the wired connections between the TiA 101, optical detector 102 and decoupling capacitor 103 result in the inductances 702-705 in the AC path, as depicted in the circuit diagram. The value of these inductances 702-705 are dependent on the length and thickness of the bond wires used to connect the circuit components 101-103. If these inductance value 702-705 are large, then they will result in a diminished RF performance and significantly decreased stability, particularly at 10 Gb/s speeds.

As shown in FIG. 7b, directly attaching the optical detector 202, 802 to the TiA 201, 801 and including the decoupling capacitor(s) 203, 803 on the same integrated circuit as the TiA 201, 801 results in a closed loop circuit with no inductance in the AC path In illustrated example, the only inductance 710 remaining in the AC path is caused by the electrical connection between the TiA 201, 801 and optical detector 202, 802, which is required for tuning of the input stage.

The inductors L1 and L2 depicted in FIG. 7b are the bondwire connections to the optical receiver module (e.g., wire bonds 206 shown in FIG. 2a), and are non-critical to the circuit's operation. In fact, large inductances L1 and L2 caused by long bondwires external to the closed loop circuit may actually improve performance by helping to keep the AC currents on-chip.

Very high gain TiAs are becoming popular in the marketplace. At the same time, receiver packages are being made with lesser quality of electrical design to save production costs. The closed loop circuit design depicted in FIG. 7b, using the example optical receiver modules shown in FIGS. 2a and 8a, helps to ensure that a high gain TiA will be stable in a relatively poor quality receiver package. For instance, if a receiver package is used that has poor electrical output to input isolation, some of the output signal can leak back into the input, and combined with a high gain may cause the TiA to oscillate. The closed loop circuit illustrated in FIG. 7b substantially reduces this phenomena by keeping inductors out of the AC path.

Figure 8A:
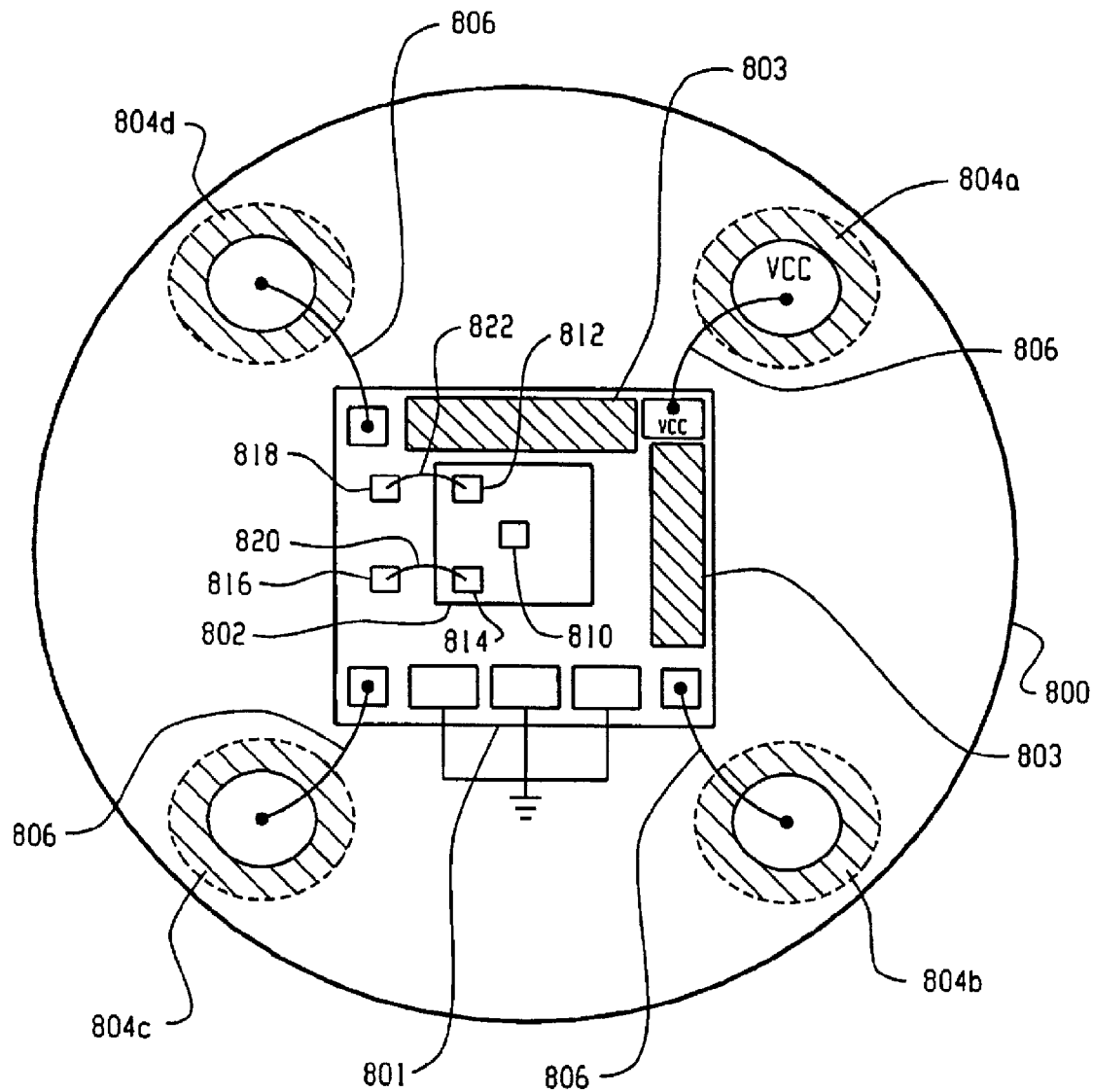
FIGS. 8a-8c depict another example optical receiver module having an integrated optical detector.
Figure 8B:
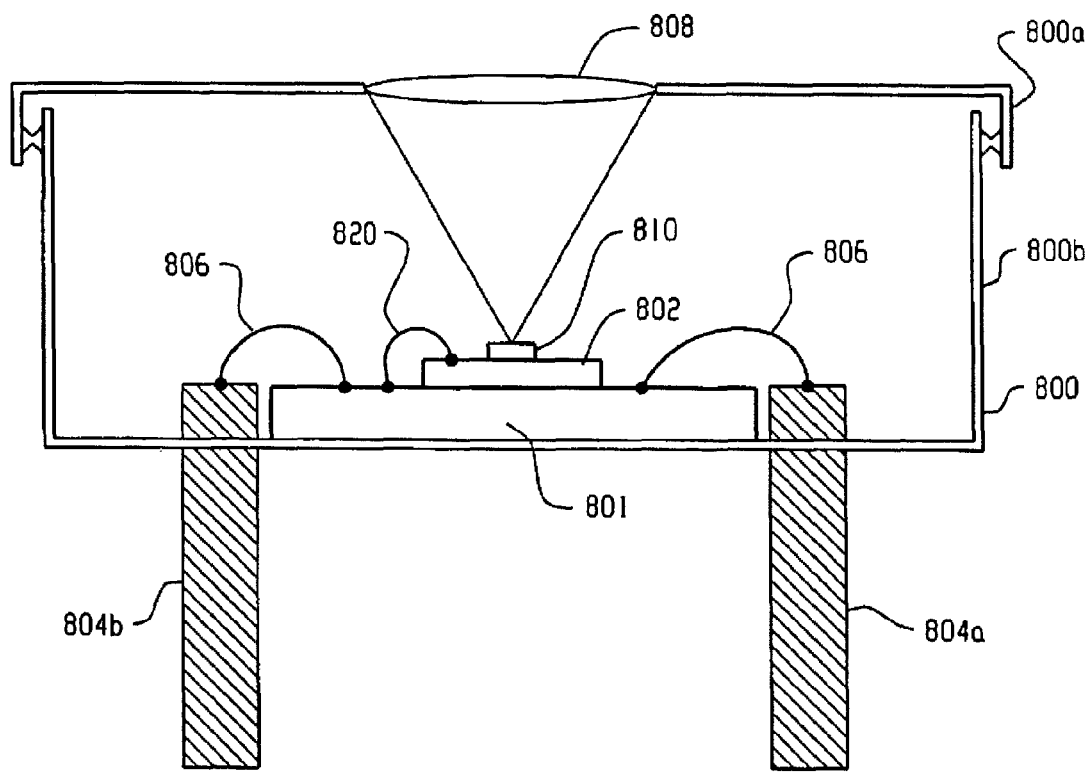
Figure 8C:
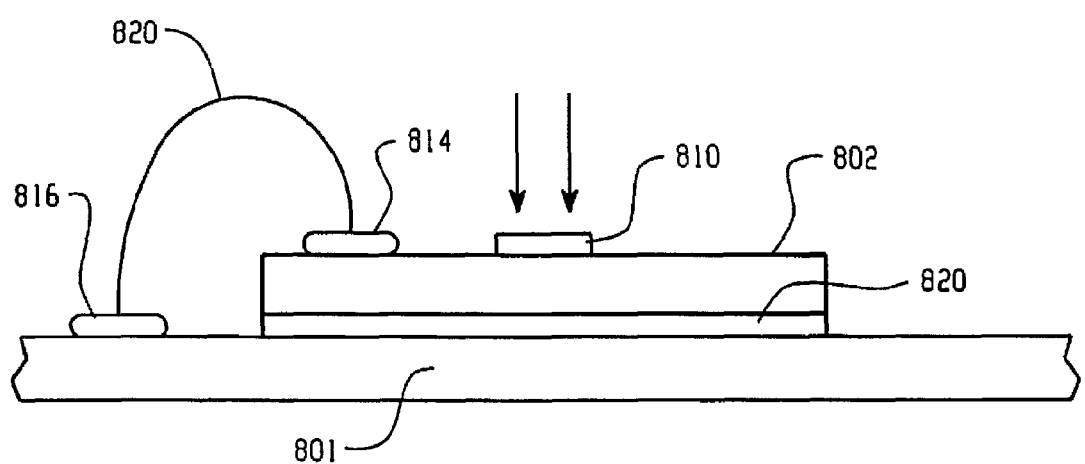

FIGS. 8a-8c depict another example optical receiver module 800 having an integrated optical detector 802. This example 800 is similar to the example depicted in FIGS. 2a-2e, except that the attached optical detector 802 is electrically connected using short wire bonds 820, 822, instead of a flip-chip connection. The short wire bonds 820, 822 electrically connect metallized pads 812, 814 on the optical detector 802 to metalized pads 816, 818 on the integrated circuit 801. In addition, because a wire bond method is used to electrically connect the components 801, 802, the photosensitive area 810 and the metalized pads 812, 814 on the optical detector 802 are located on a top surface of the module, instead of on the surface of the optical detector 802 facing the integrated circuit 201. Thus, as illustrated in FIG. 8b, light is focused through a lens 808 to illuminate the photosensor 810 on an outward facing surface of the optical detector 802 (i.e., the optical detector in this example is not back illuminated). As a result, either a short wavelength (SW) or long wavelength (LW) photodiode may be used for the optical detector 802 in this example 800. For example, the optical detector 802 used in the receiver module 800 of FIG. 8a could be an InP diode that is configured to operate with LW light (e.g., 1310 nm/1550 nm) or a GaAs diode that is configured to operate with SW light (e.g., 850 nm).

FIG. 8c depicts a cross-sectional view showing the direct attachment between the optical detector 802 and the integrated circuit 801. Also illustrated is a short wire bond connection 820 between a metalized pad 814 on the optical detector 802 and a metalized pad 816 on the integrated circuit 810. The optical detector 802 may, for example, be physically attached to the integrated circuit 801 using an adhesive layer 820, or by some other means for physically bonding two materials. It should be noted that the example of FIG. 8c provides the advantages of the circuit shown in FIG. 7b, because the bondwire attachment is actually a small and repeatable part of the inductor 710, the rest of which is fabricated on-chip.

Figure 9:
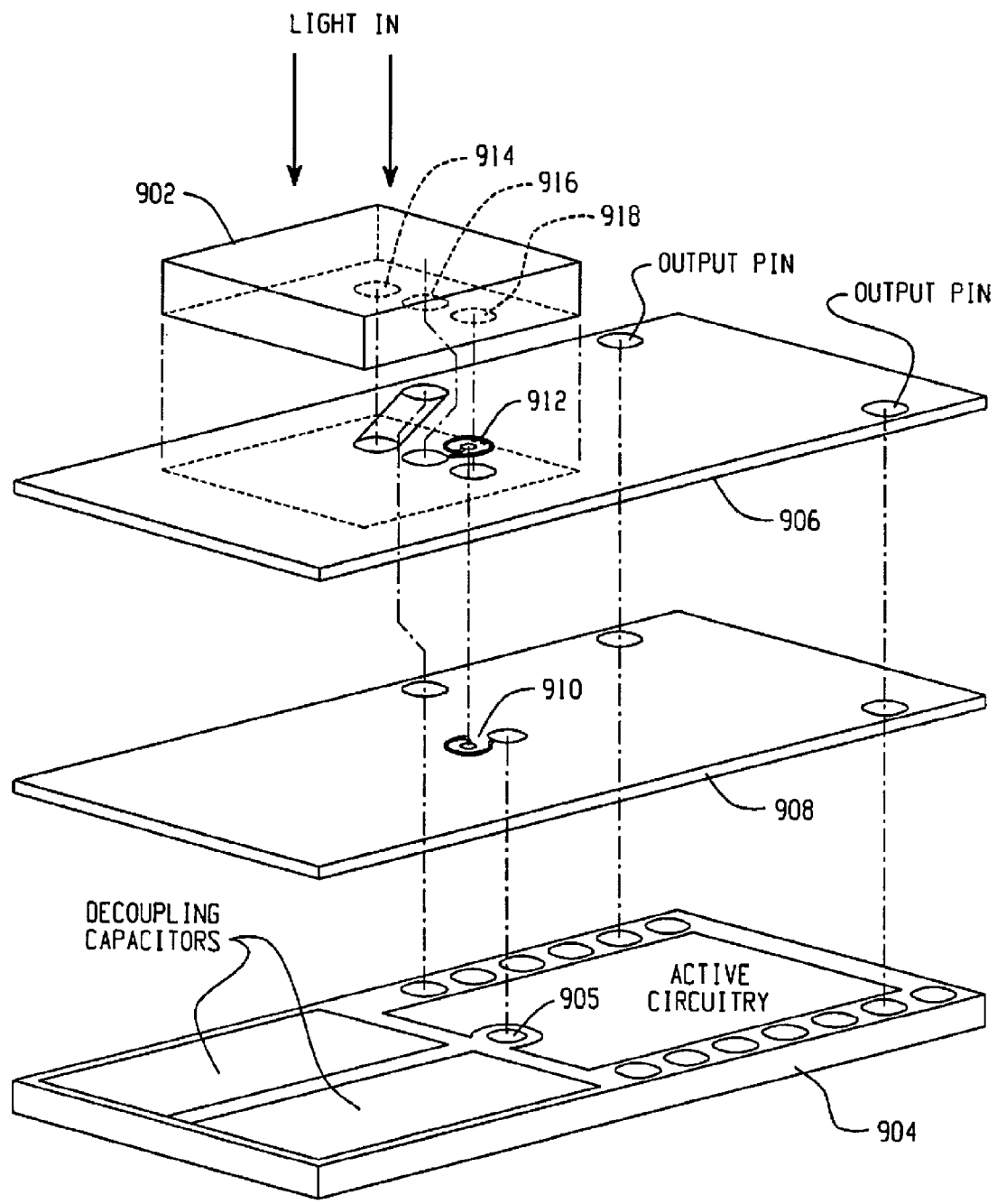
FIG. 9 is an exploded view of an example optical receiver module having an integrated optical detector and two redistribution layers with tuning inductors.

FIG. 9 is an exploded view of an example optical receiver module 900 having an integrated optical detector 902 and two redistribution layers 906, 908 with tuning inductors 910, 912. The optical receiver module 900 includes an integrated circuit 904, two redistribution layers 906, 908 and an optical detector 902. The integrated circuit 904 may include a TiA and one or more decoupling capacitors, as described above. The redistribution layers 906, 908 are fabricated on top of the integrated circuit 904 using known techniques, and the optical detector 902 is attached to the module 900 on top of the redistribution layers. The tuning inductors 910, 912 may, for example, be fabricated on the redistribution layers 906, 908 using a thin-film material or using some other suitable inductive material. In the illustrated example 900, the optical detector 902 is attached using flip-chip bonding techniques to attach the metalized pads 914, 916, 918 on the lower surface of the optical detector 902 to metal-filled vias in the top-most redistribution layer 906. In another example, however, the optical detector 902 could be physically attached to the redistribution layer 906 and electrically connected using short wire bonds, similar to the optical receiver module 800 illustrated in FIGS. 8a-8c. In addition, two redistribution layers 906, 908 are shown for illustration, however, any number of redistribution layers could be included. Typically, one to five redistribution layers will be used, however, more than five redistribution layers could also be used.

In the illustrated example 900, the center-most metalized pad 916 on the optical detector 902 is coupled to one end of the tuning inductor 912 on the top redistribution layer 906. The other end of the tuning inductor 912 is coupled to the tuning inductor 910 on the bottom redistribution layer 908, which is coupled to a metalized pad 905 on the integrated circuit. In this manner, a series connection is made from the pad 916 on the optical detector 902, through the two tuning inductors 912, 910, to the pad 905 on the integrated circuit. In addition, the output pins of the integrated circuit 904 are connected through metal-filled vias to the top redistribution layer 906 for user access, and ground pads 914, 918 on the optical detector 902 are connected through metal-filled vias to ground pads on the integrated circuit 904.

Cross-referencing FIG. 9 and the closed loop circuit depicted in FIG. 7b, the tuning inductors 910, 912 in this example are used to control the inductance 710 in the connection path between the integrated circuit 904 and the optical detector 902. The amount of inductance 710 desired to tune any given TiA may vary with every batch of material used to fabricate the optical receiver module 900. Each time the IC fabrication process is completed and a batch of TIA's is produced, a slightly different inductance 710 may be desired. By varying the value of the inductors 910, 912 in the redistribution layers 906, 908, each wafer of TIA's can be specifically tuned to achieve optimal performance.

It should be understood that under normal circumstances, the receiver manufacturer would have to vary the inductance of 710 for every batch of TIA's, because every batch is slightly different and therefore requires a different inductance value to optimize performance. In the examples described herein, however, the 'required' inductance for any wafer of TIA's can be measured, and then a suitable re-distribution layer can be deposited on the wafer with the required inductance value.

This written description uses examples to disclose the invention, including the best mode, and also to enable a person skilled in the art to make and use the invention. The patentable scope of the invention may include other examples that occur to those skilled in the art. For instance, in one alternative example, the testing methods described herein may be used to test single optical receiver modules, instead of testing a plurality of receivers at once on a wafer. That is, the optical receiver modules may be diced from the wafer before testing, and the testing method may be performed on an individual module. In another example, the integrated circuit may be diced from the wafer before the optical detector is attached, and the final optical receiver module may then be tested. In this manner, the final assembly process in which the optical detector is attached to the integrated circuit may be performed by the customer who purchases a single integrated circuit, instead of by the integrated circuit manufacturer, and the customer may perform testing on the single assembled module.

It is claimed:

1. An optical receiver module, comprising:
   a housing;
   a plurality of header pins attached to the housing and electrically isolated from the housing;
   an aperture disposed in the housing for providing light through the housing;
   an optical detector that receives light and generates photocurrent in response to the received light; and
   an integrated circuit that receives the photocurrent and amplifies the photocurrent to generate an output signal;
   the integrated circuit being formed on a single substrate, the single substrate being made from a semiconductor material;
   the optical detector being mounted within the housing between the plurality of header pins such that it is proximate the aperture and positioned for receiving light;
   the optical detector being electrically connected exclusively to the integrated circuit;
   wherein all of the electrically isolated header pins within the optical receiver module include at least one wire bond connected exclusively to the integrated circuit.

2. The optical receiver module of claim 1, wherein the optical receiver does not include any decoupling capacitors within the housing other than one or more decoupling capacitors that are integral to the integrated circuit.

3. The optical receiver module of claim 1, wherein the optical detector is electrically coupled to the integrated circuit using a flip-chip bond.

4. The optical receiver module of claim 1, wherein the optical detector is electrically coupled to the integrated circuit using a wire bond.

* * * * *